United States Patent
Ikeda et al.

(10) Patent No.: US 12,009,180 B2
(45) Date of Patent: Jun. 11, 2024

(54) PLASMA PROCESSING APPARATUS

(71) Applicant: Hitachi High-Tech Corporation, Tokyo (JP)

(72) Inventors: Norihiko Ikeda, Tokyo (JP); Kazuya Yamada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/435,509

(22) PCT Filed: Aug. 27, 2020

(86) PCT No.: PCT/JP2020/032428
§ 371 (c)(1),
(2) Date: Jan. 27, 2022

(87) PCT Pub. No.: WO2022/044216
PCT Pub. Date: Mar. 3, 2022

(65) Prior Publication Data
US 2024/0014007 A1    Jan. 11, 2024

(51) Int. Cl.
*H01J 37/32*    (2006.01)

(52) U.S. Cl.
CPC .. *H01J 37/32183* (2013.01); *H01J 37/32128* (2013.01); *H01J 37/32146* (2013.01);
(Continued)

(58) Field of Classification Search
None
See application file for complete search history.

(56) References Cited

U.S. PATENT DOCUMENTS

| | | | |
|---|---|---|---|
| 2008/0110859 A1 | 5/2008 | Koshiishi et al. | |
| 2011/0230038 A1* | 9/2011 | Hayashi | H01L 21/2236 438/513 |

(Continued)

FOREIGN PATENT DOCUMENTS

| | | |
|---|---|---|
| JP | S59047733 A | 3/1984 |
| JP | 2011198983 A | 10/2011 |

(Continued)

OTHER PUBLICATIONS

Search Report dated Oct. 27, 2020 in International Application No. PCT/JP2020/032428.
(Continued)

*Primary Examiner* — Allan W. Olsen
(74) *Attorney, Agent, or Firm* — Miles & Stockbridge, P.C.

(57) ABSTRACT

A plasma processing apparatus includes: a processing chamber; a first radio frequency power supply configured to supply a first radio frequency power; a second radio frequency power supply configured to supply a second radio frequency power; and a control device configured to, when the first radio frequency power is modulated by a first waveform having a first period and a second period adjacent to the first period, and the second radio frequency power supply is modulated by a second waveform having a period A and a period B, control the second radio frequency power supply such that each second radio frequency power in the period A is supplied in the first period and the second period, in which an amplitude in the second period is smaller than an amplitude in the first period, and an amplitude in the period A is larger than an amplitude in the period B.

11 Claims, 16 Drawing Sheets

(52) U.S. Cl.
CPC .. *H01J 37/32201* (2013.01); *H01J 37/32293* (2013.01); *H01J 37/32311* (2013.01); *H01J 2237/3343* (2013.01)

(56) References Cited

U.S. PATENT DOCUMENTS

2015/0170886 A1   6/2015   Morimoto et al.
2017/0092468 A1   3/2017   Shiina et al.

FOREIGN PATENT DOCUMENTS

| | | |
|---|---|---|
| JP | 2014220360 A | 11/2014 |
| JP | 2015115564 A | 6/2015 |
| JP | 2016027667 A | 2/2016 |
| JP | 2017069542 A | 4/2017 |
| JP | 2020017565 A | 1/2020 |
| WO | 2008044633 A1 | 4/2008 |

OTHER PUBLICATIONS

Written Opinion dated Oct. 27, 2020 in International Application No. PCT/JP2020/032428.

* cited by examiner

[FIG. 1]
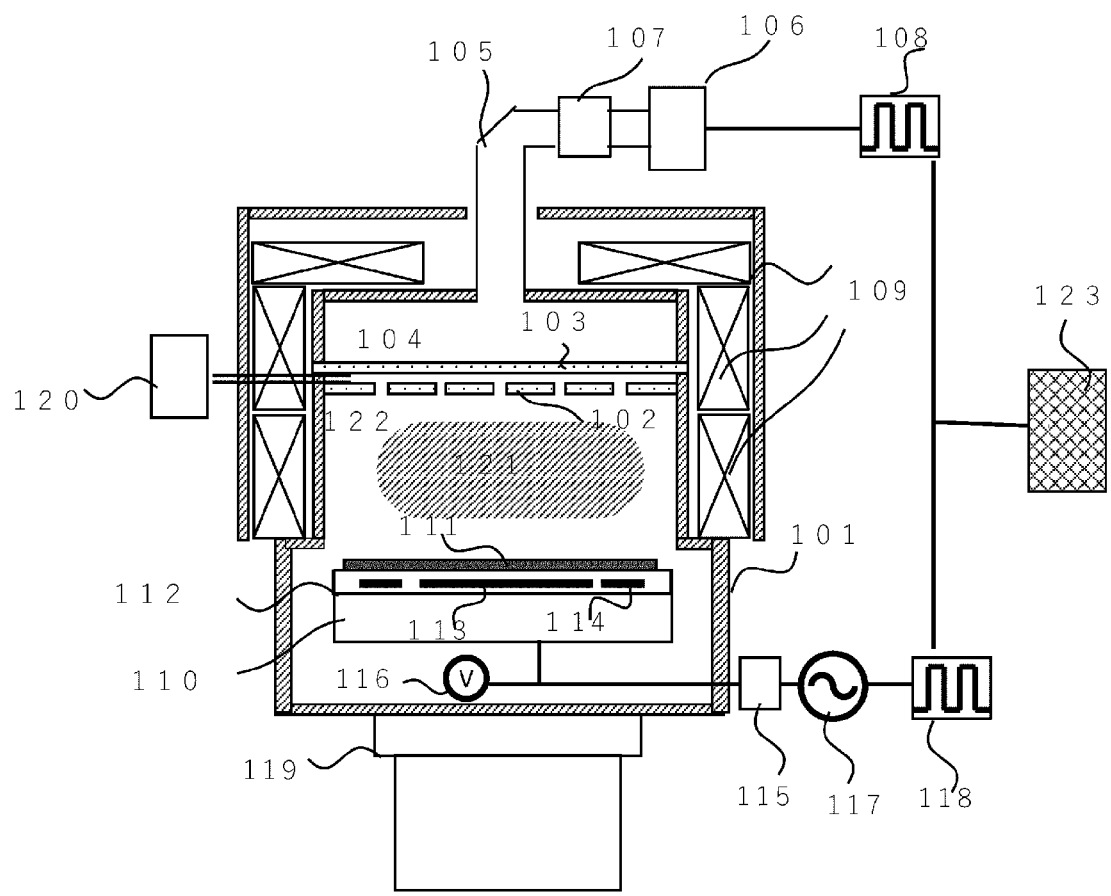

[FIG. 2]
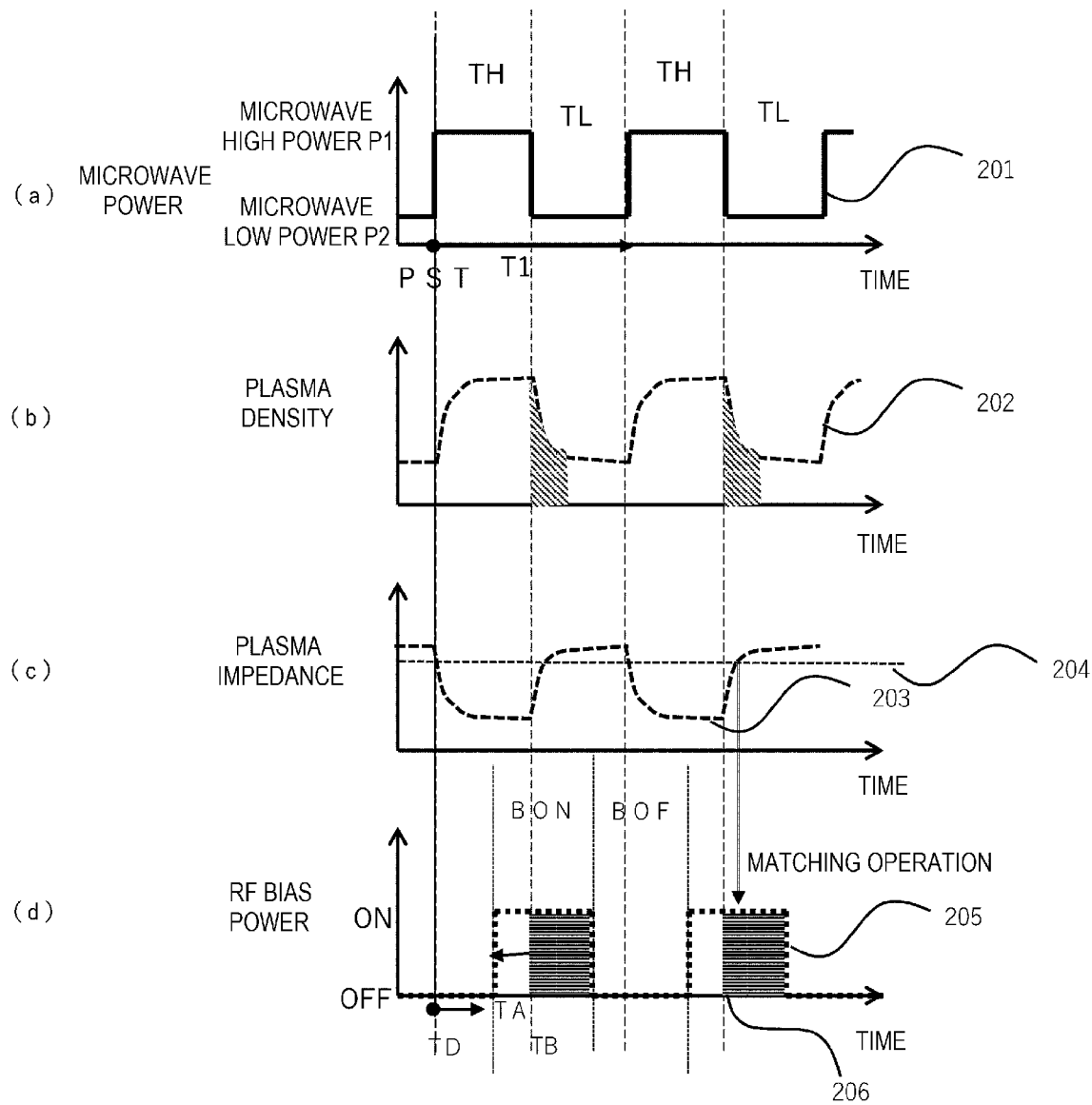

[FIG. 3A]
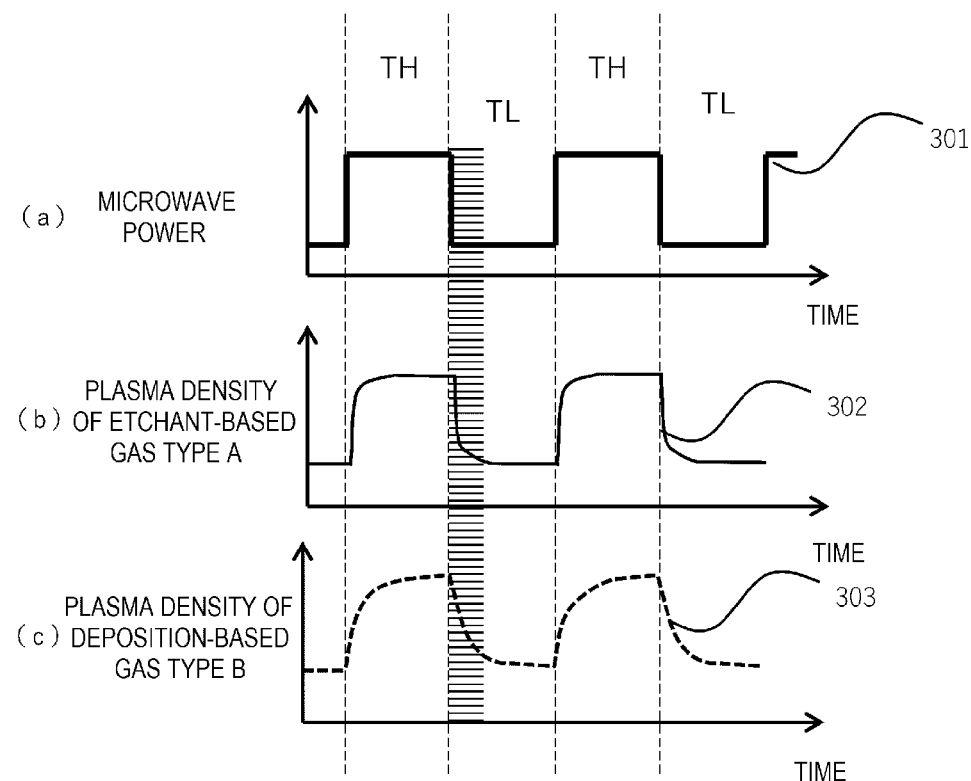

[FIG. 3B]
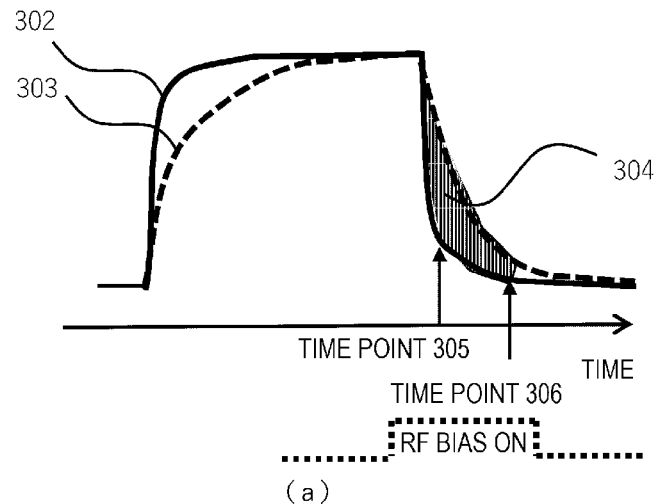
(a)
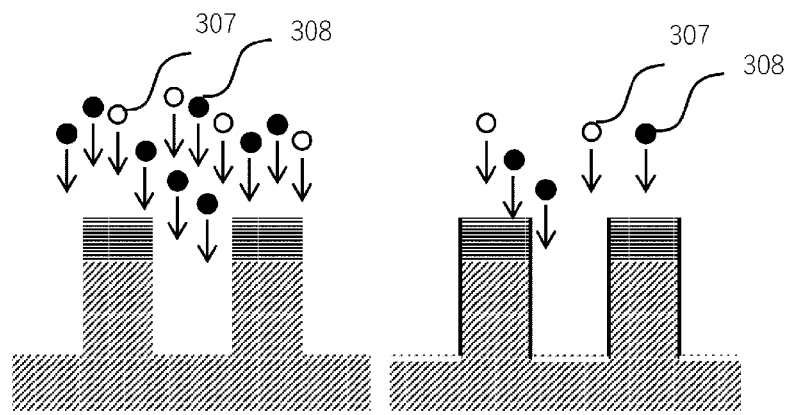
| ETCHING SHAPE | ETCHING SHAPE |
| (TIME POINT 305) | (TIME POINT 306) |
| (b) | (c) |

[FIG. 4A]
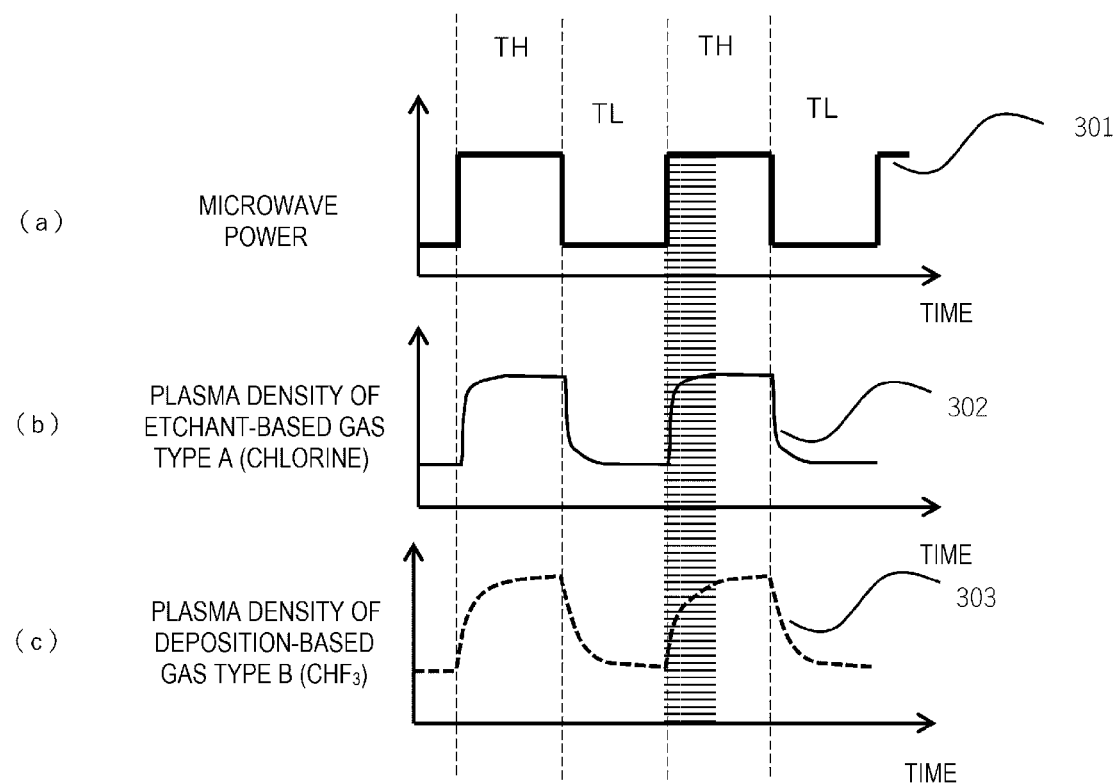

[FIG. 4B]
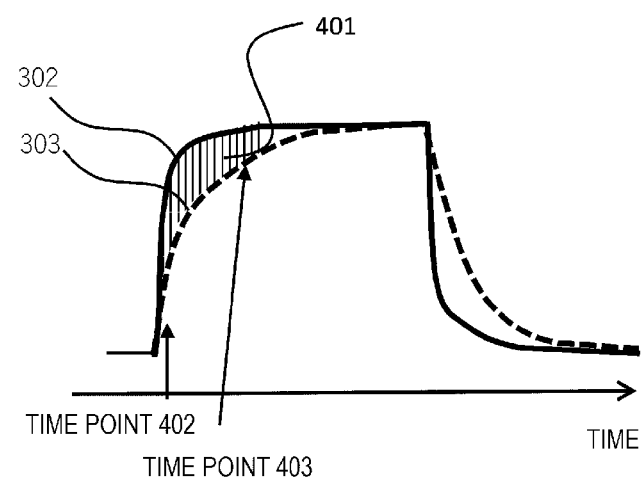
(a)
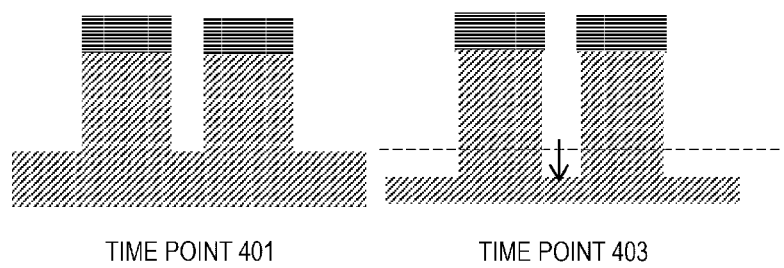
TIME POINT 401    TIME POINT 403
(b)              (c)

[FIG. 5]
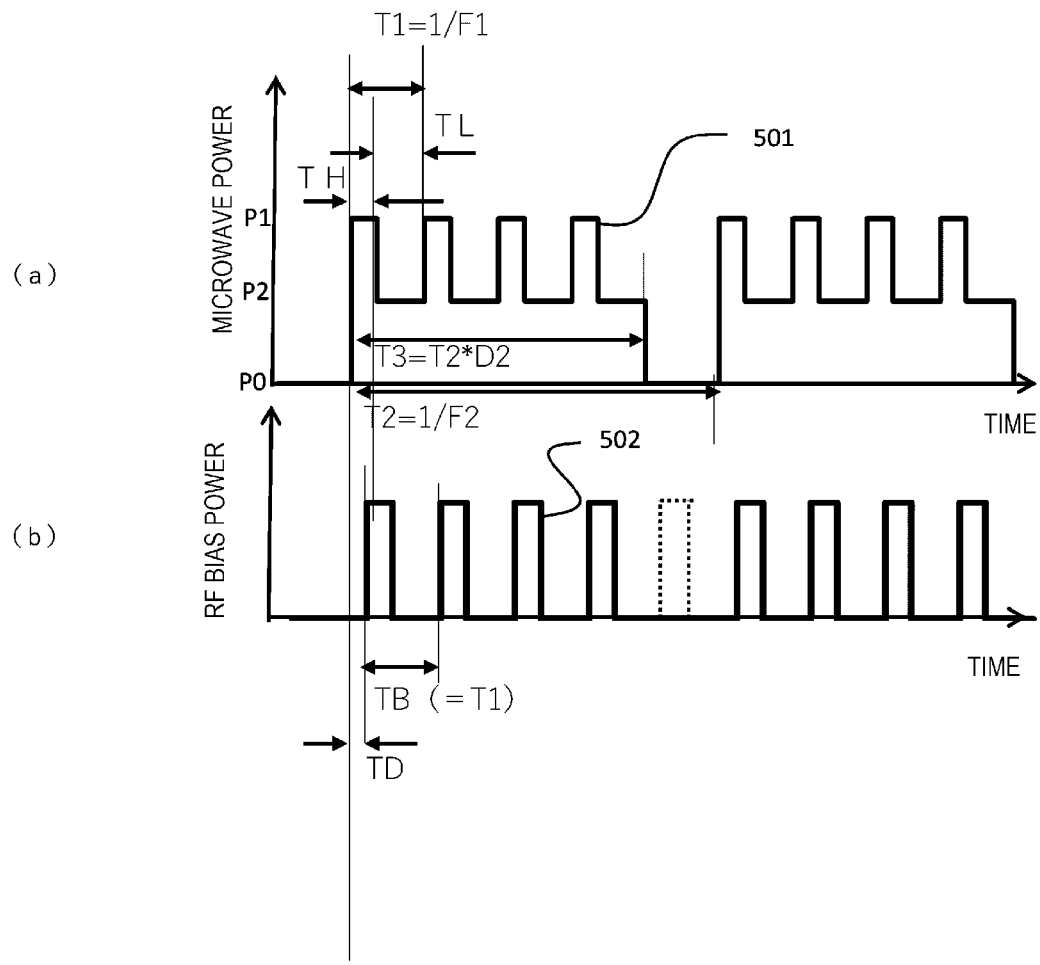

[FIG. 6]
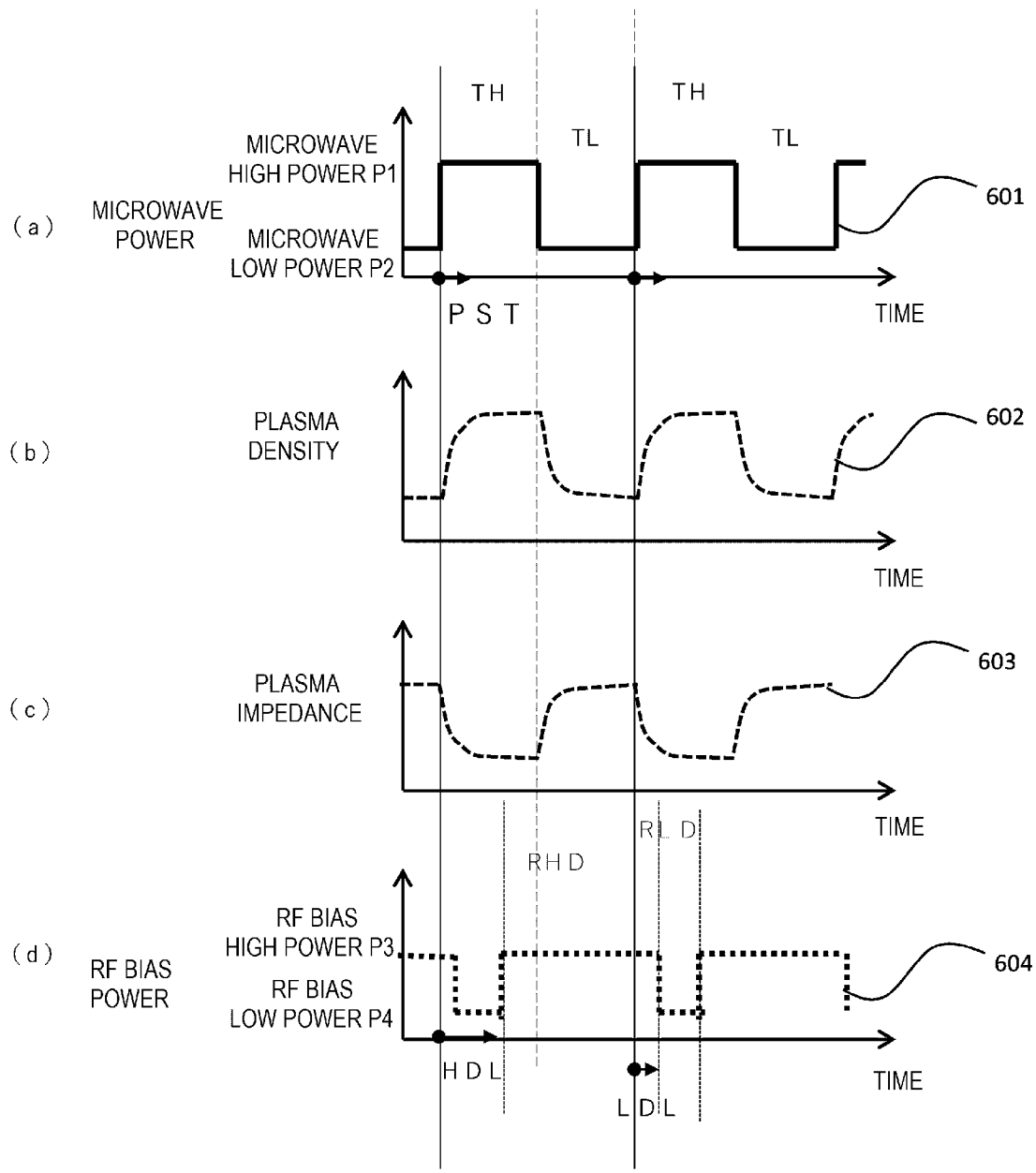

[FIG. 7]
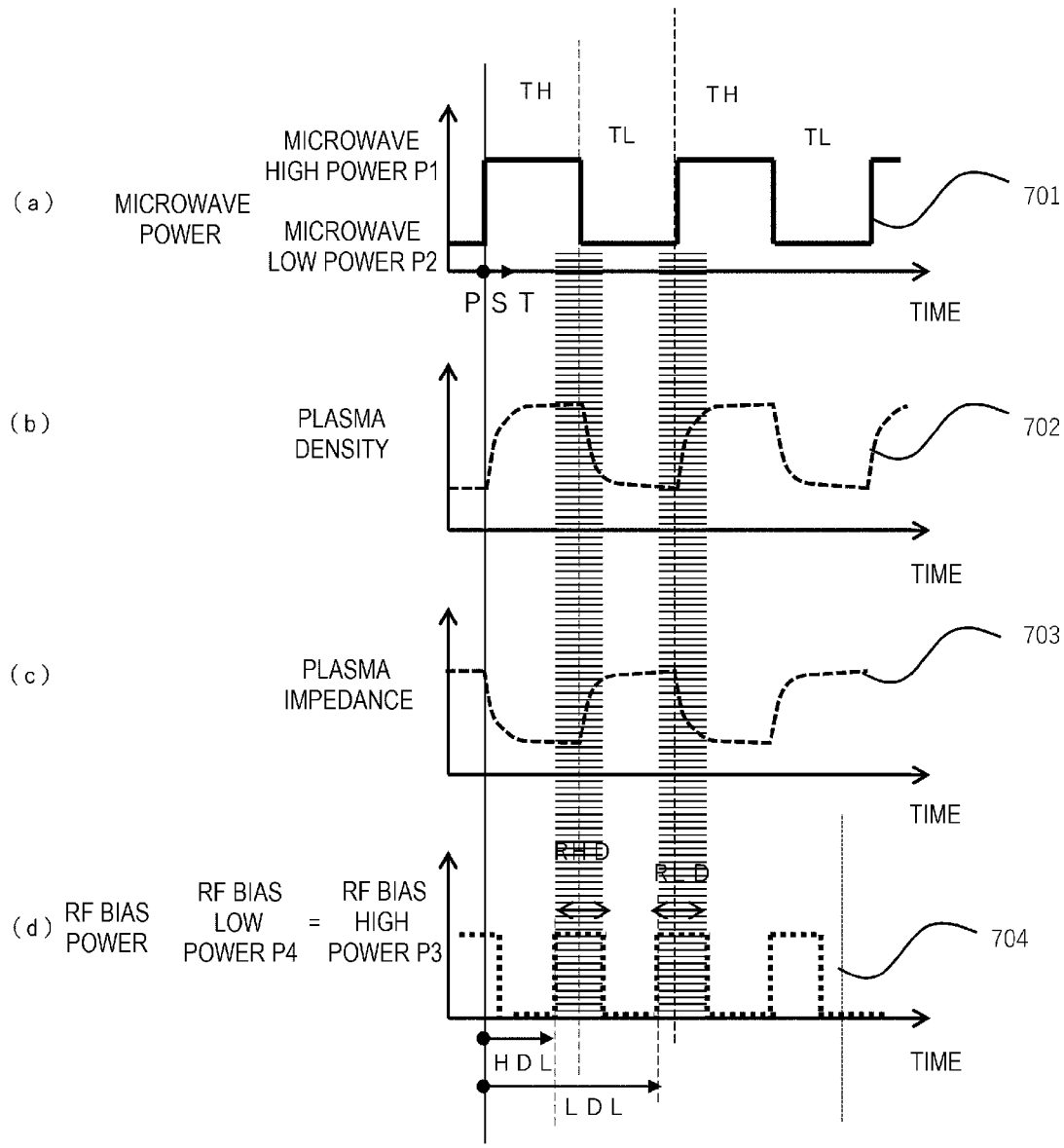

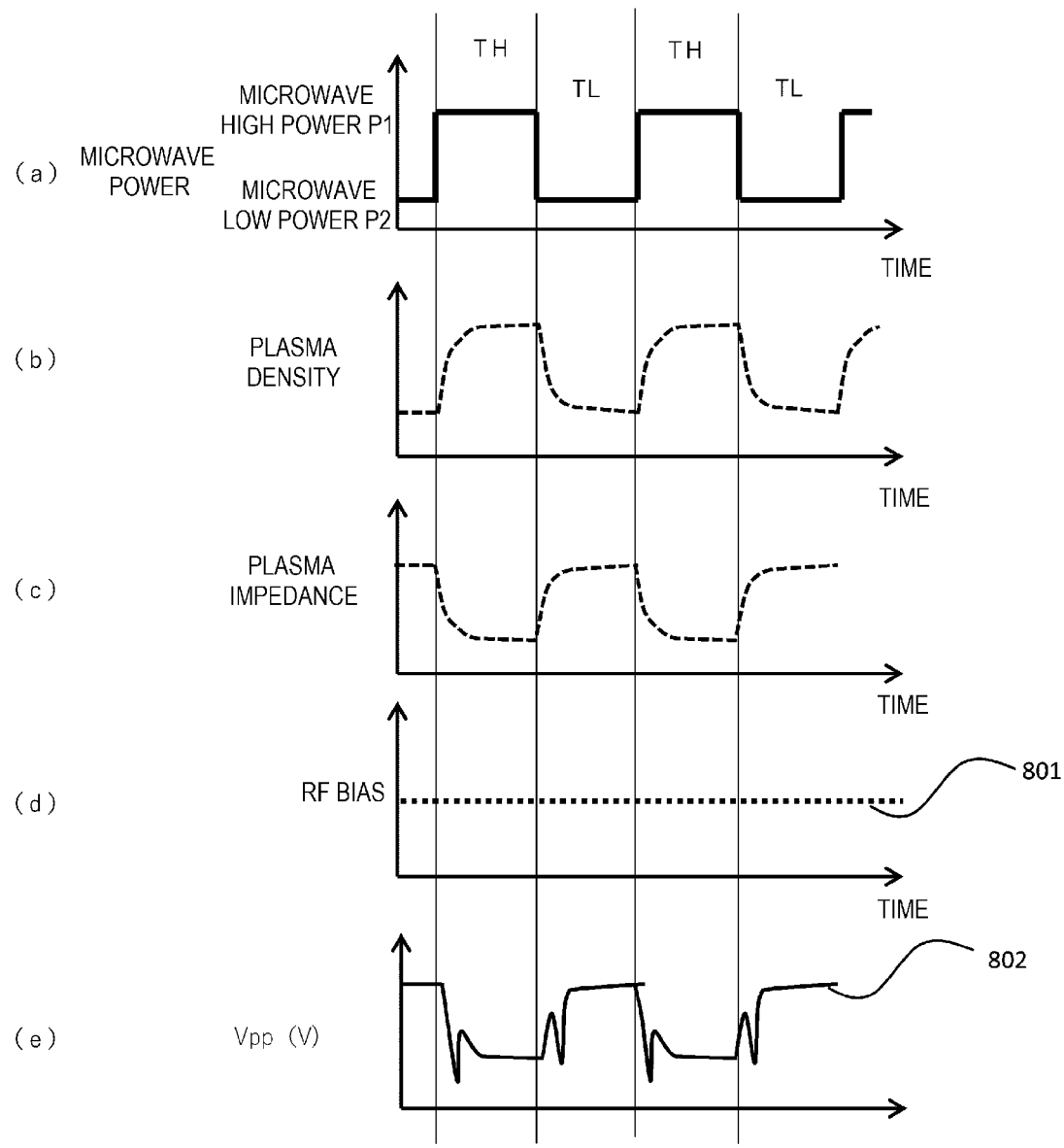
[FIG. 8A]

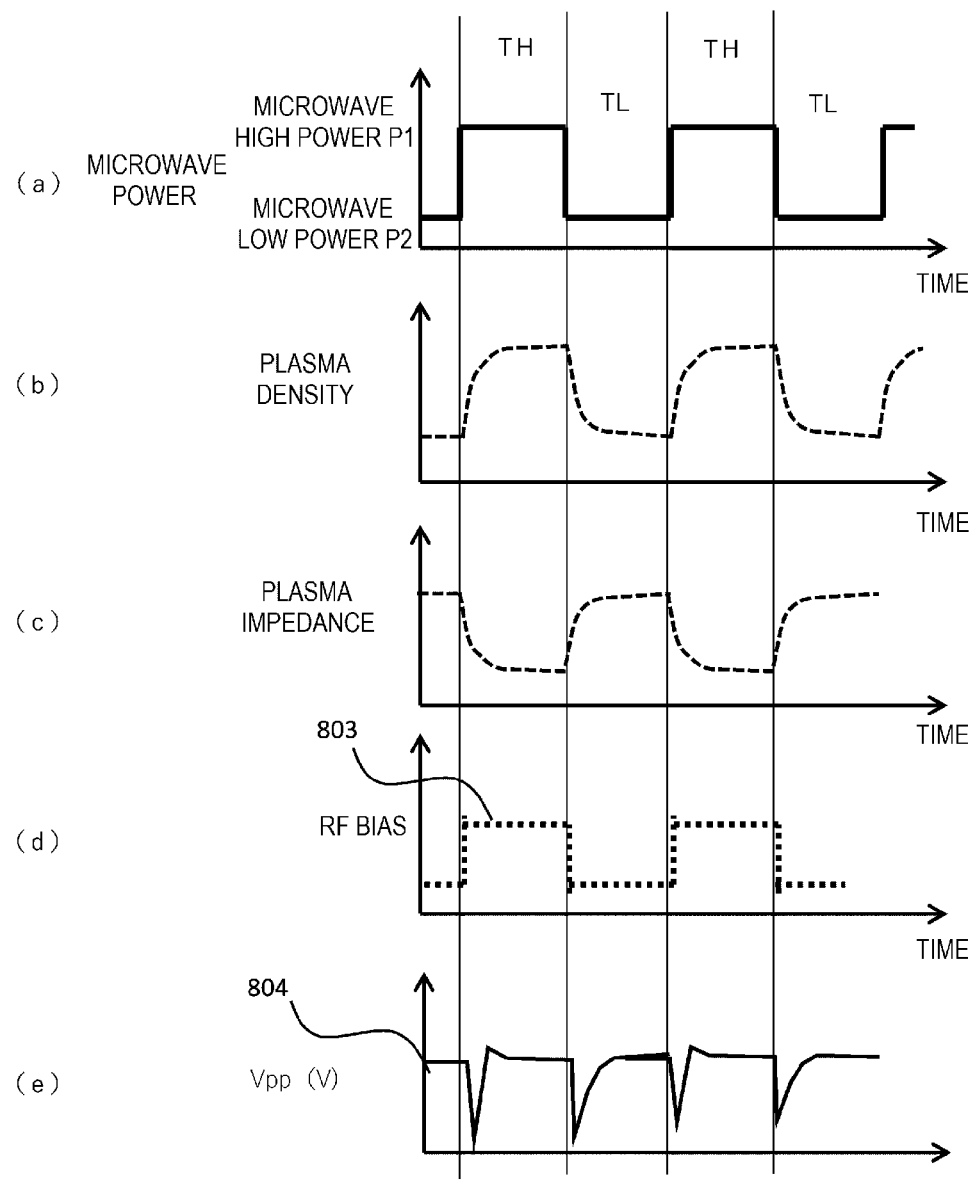
[FIG. 8B]

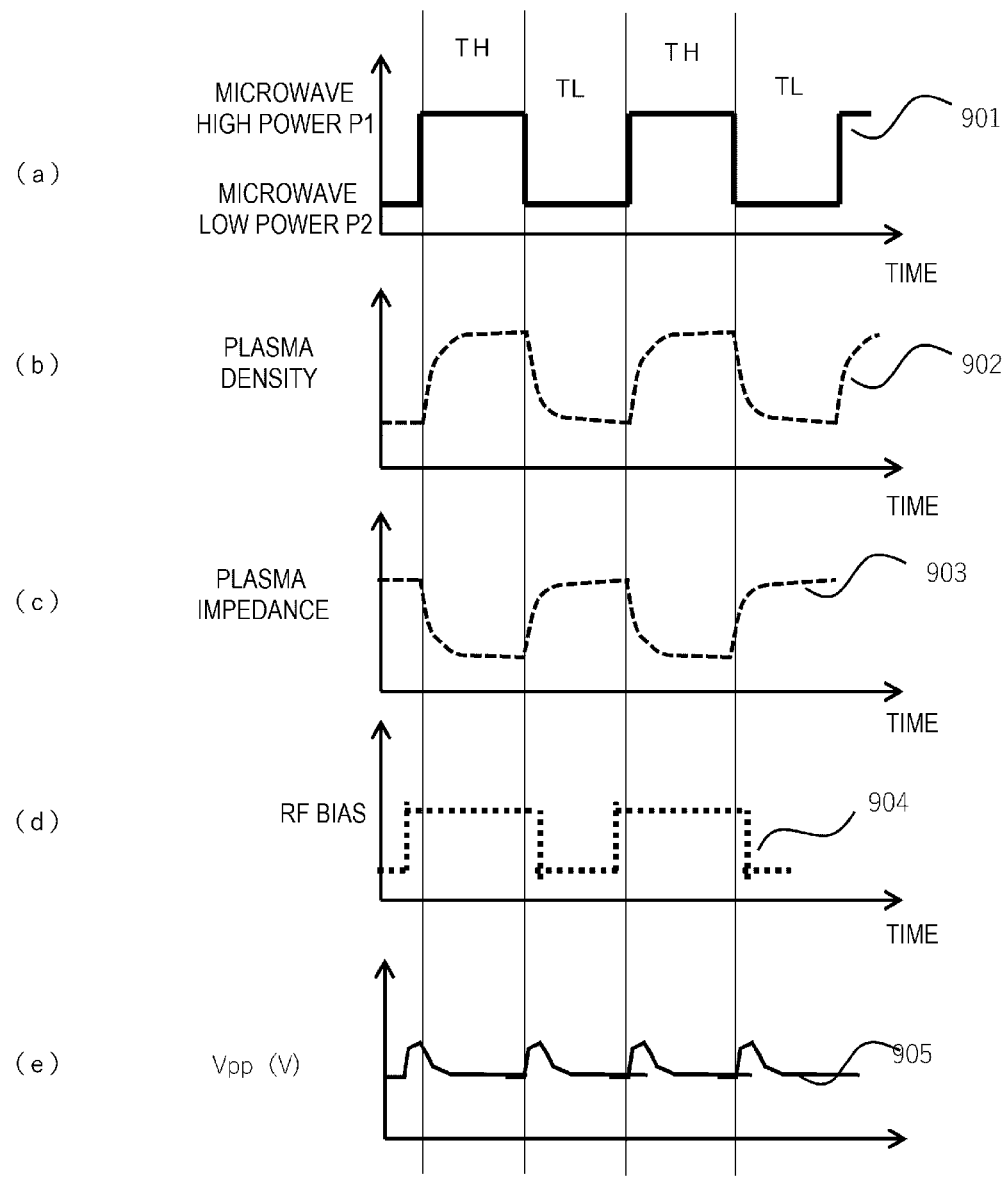
[FIG. 9]

[FIG. 10]
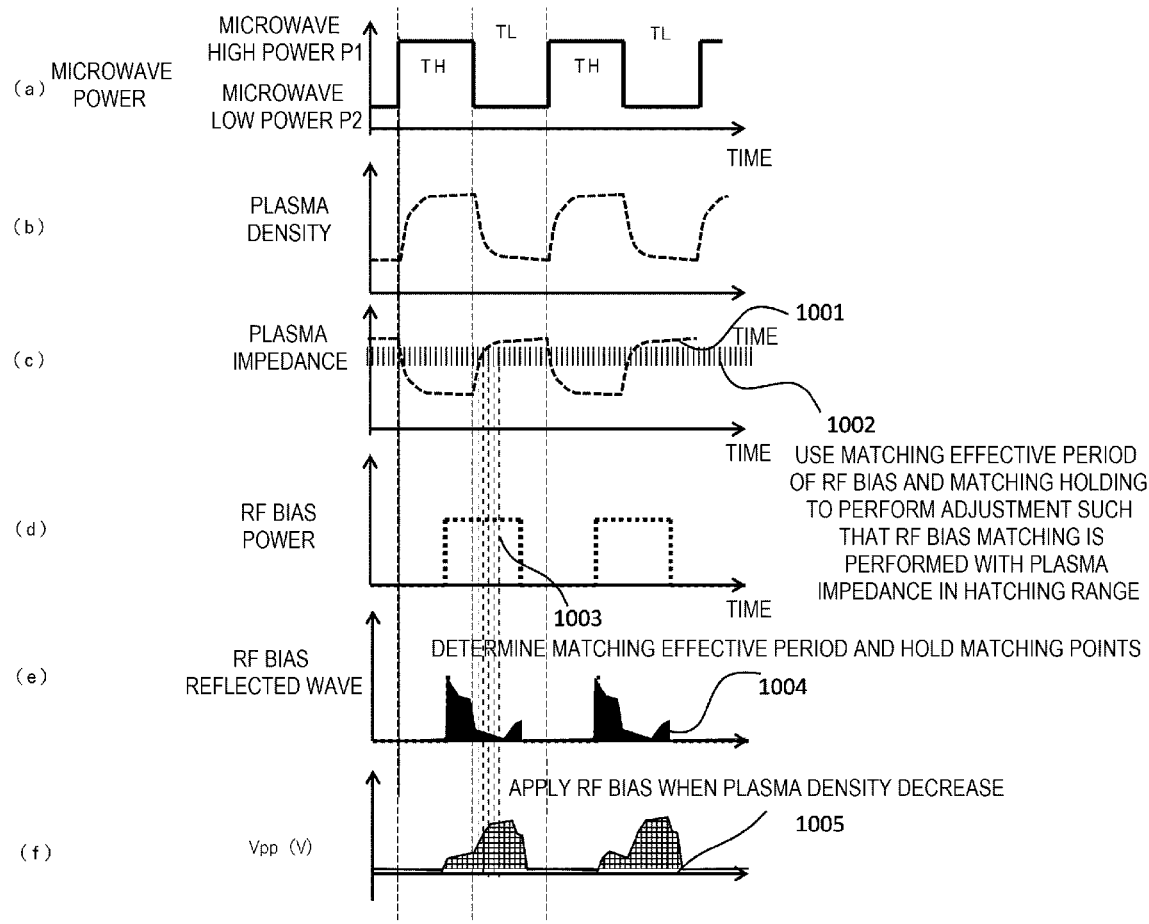

[FIG. 11A]
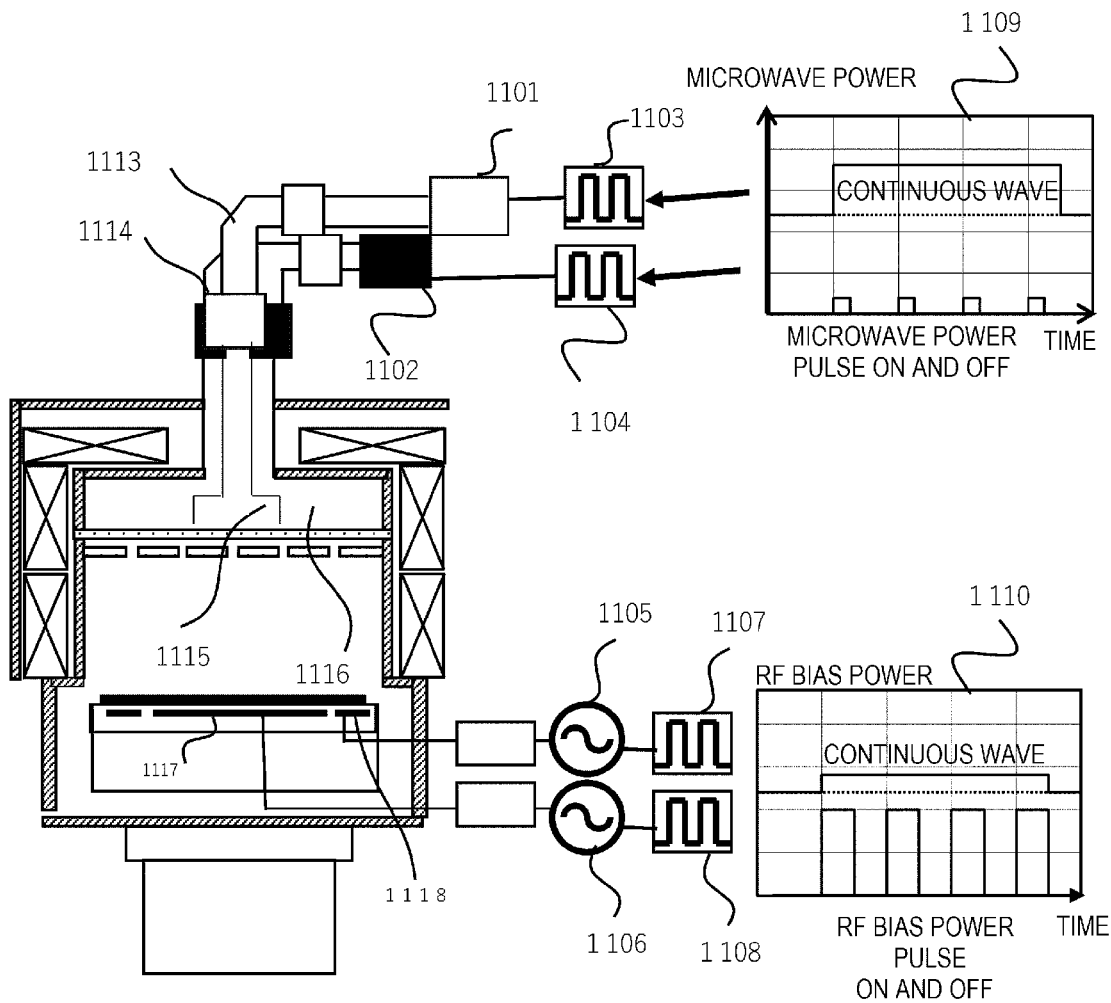
[FIG. 11B]
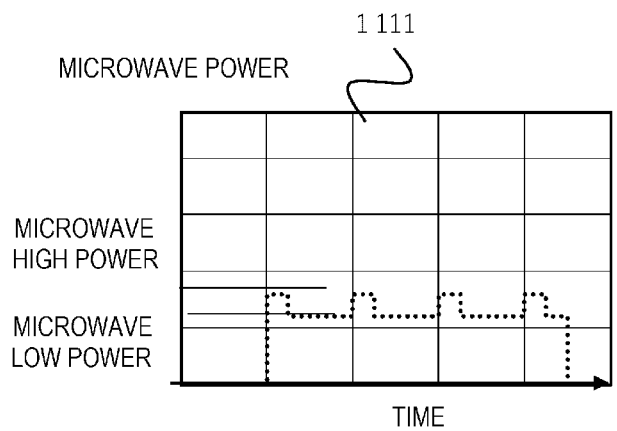

[FIG. 11C]
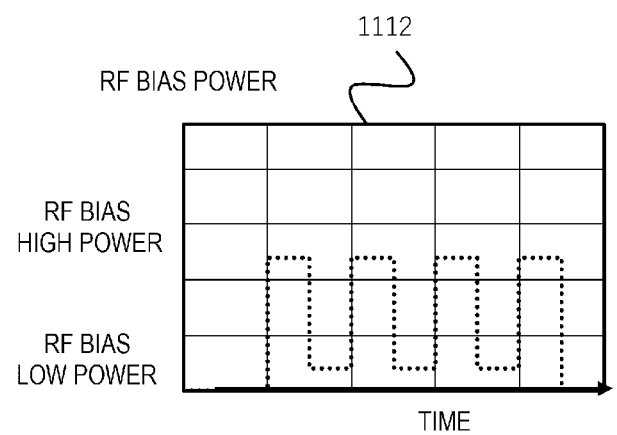

PLASMA PROCESSING APPARATUS

TECHNICAL FIELD

The present invention relates to a plasma processing apparatus.

BACKGROUND ART

In an electron cyclotron resonance (ECR) type plasma etching apparatus, radio frequency (RF) power is used to accelerate ions entering a semiconductor element.

In recent years, with an increase in an integration degree of semiconductor devices, there has been a demand for both shape controllability in etching and wafer in-plane uniformity. As one of techniques for implementing high-precision plasma etching, PTL 1 discloses a plasma etching method in which a magnitude of energy supplied to a plasma forming unit is adjusted so that plasma periodically forms a strong plasma state and a weak plasma or a plasma annihilation state.

PTL 2 discloses a method of applying a synchronized RF bias power to a time-modulated source power supply (microwave) and applying a RF bias power of which a phase is modulated to the time-modulated microwave.

Further, there is a technique in which a plasma generation source power supply can apply pulses not only in two states of pulse on and pulse off, but also in three (or more) sections including pulse high, pulse low, and pulse off. PTL 3 discloses a method of implementing pattern vertical etching having a density difference by applying an RF bias power to a pulse low section.

PTL 4 discloses a method of implementing etching in which a microwave output value is set to two or more output values in a pulse on section so that an etching rate distribution is made uniform and isotropic etching can be prevented.

In all of these techniques in the related art, a source power supply for generating plasma is pulsed to aim at low density plasma and low dissociation etching, and an RF bias power is applied in consideration of plasma types and a plasma density to draw plasma with an appropriate ion amount and ion energy into a wafer, thereby aiming at the etching shape, a selectivity ratio, and the wafer in-plane uniformity.

CITATION LIST

Patent Literature

PTL 1: JP-A-S59-47733
PTL 2: JP-A-2015-115564
PTL 3: JP-A-2017-69542
PTL 4: JP-A-2020-17565

SUMMARY OF INVENTION

Technical Problem

However, although the low dissociation etching can be implemented by applying the pulsed source power for generating plasma, there are various problems in the related art.

For example, when the RF bias power is a continuous wave even when the source power is simply pulsed, the RF bias power cannot be applied at the time of a plasma misfire. In contrast to this, in order to prevent the plasma misfire, when an off period of the pulsed source power is limited to be short and a pulse repetition frequency is increased, there is a problem that the plasma density does not decrease.

On the other hand, when the microwave power and the RF bias power are pulsed and synchronized, there is a problem that an etching rate is reduced. In this case, the microwave power, which is the source power, and the RF bias power both have a certain off period, and thus the etching rate decreases. Further, depending on a pulse on time and a duty ratio of the source power, the etching rate becomes very slow.

In addition, when the RF bias power is applied at the same timing as a pulse oscillation of the microwave power, the etching may be performed in a state where matching with the RF bias power is insufficient. For this reason, deterioration of the in-plane uniformity of the etching or deterioration of reproducibility may be caused by abnormal discharge or reflected wave abnormality of each power supply.

On the other hand, after the microwave power is pulse-oscillated, the RF bias power may be applied after waiting until a plasma stabilization time elapses. As a result, the etching rate distribution becomes uniform, and the in-plane uniformity is improved. However, according to such a technique, since the RF bias power has a zero section, side etching is performed, so that a shape defect of the etching cannot be completely avoided.

Further, the pulse oscillation of the microwave power may be binarized to high and low, and the RF bias may be applied to a low section of the microwave. However, a problem of this technique is that, in addition to a fact that the side etching in which almost no deposition component is in the plasma is likely to occur in the low section of the microwave, it is difficult to match the RF bias power under the plasma in which the microwave power is applied to a limit at which the plasma misfire can be prevented.

As described above, there is a demand for a technique that maintains the shape controllability of the etching and does not decrease the etching rate even when the etching is performed at a low plasma density by pulse-oscillating the microwave power.

An object of the invention is to provide a plasma processing apparatus that controls the etching shape with high accuracy by using a microwave power supply capable of oscillating different microwave powers.

Solution to Problems

In order to solve the above problems, one typical plasma processing apparatus according to the invention includes: a processing chamber in which a sample is subjected to plasma processing; a first radio frequency power supply configured to supply a first radio frequency power with which plasma is generated; a sample stage on which the sample is placed; a second radio frequency power supply configured to supply a second radio frequency power to the sample stage; and a control device configured to, when the first radio frequency power is modulated by a first waveform having a first period and a second period adjacent to the first period and the second radio frequency power supply is modulated by a second waveform having a period A and a period B, control the second radio frequency power supply such that each second radio frequency power in the period A is supplied in the first period and the second period, in which an amplitude in the second period is smaller than an amplitude in the first period and larger than 0, and an amplitude in the period A is larger than an amplitude in the period B.

3

Advantageous Effect

According to the invention, it is possible to provide a plasma processing apparatus that controls an etching shape with high accuracy by using a microwave power supply capable of oscillating different microwave powers. Problems to be solved, configurations and effects other than those described above will be clarified by description of the following embodiments.

BRIEF DESCRIPTION OF DRAWINGS

FIG. 1 is a schematic configuration diagram of an ECR plasma etching apparatus which is a plasma processing apparatus according to an embodiment of the invention.

FIG. 2 is a timing chart showing (a) microwave power, (b) plasma density, (c) plasma impedance, and (d) RF bias power according to a first embodiment.

FIG. 3A is a timing chart showing (a) microwave power, (b) plasma density of a gas type A, and (c) plasma density of a gas type B according to the first embodiment.

FIG. 3B shows (a) an enlarged view of the plasma density in FIG. 3A, (b) an enlarged cross-sectional view of a pattern shape of a wafer, and (c) an enlarged cross-sectional view of a pattern shape of the wafer.

FIG. 4A is a timing chart showing (a) microwave power, (b) plasma density of the gas type A, and (c) plasma density of the gas type B according to the second embodiment.

FIG. 4B shows (a) an enlarged view of the plasma density in FIG. 4A, (b) an enlarged cross-sectional view of a pattern shape of a wafer, and (c) an enlarged cross-sectional view of a pattern shape of the wafer.

FIG. 5 is a diagram showing an example of a timing chart of (a) pulsed microwave power and (b) pulsed RF bias power according to a third embodiment.

FIG. 6 is a timing chart showing (a) microwave power, (b) plasma density, (c) plasma impedance, and (d) RF bias power according to a fourth embodiment.

FIG. 7 is a timing chart showing (a) microwave power, (b) plasma density, (c) plasma impedance, and (d) RF bias power according to a fifth embodiment.

FIG. 8A is a timing chart showing (a) microwave power, (b) plasma density, (c) plasma impedance, (d) RF bias power, and (e) Vpp according to a comparative example.

FIG. 8B is a timing chart showing (a) microwave power, (b) plasma density, (c) plasma impedance, (d) RF bias power, and (e) Vpp according to a comparative example.

FIG. 9 is a timing chart showing (a) microwave power, (b) plasma density, (c) plasma impedance, (d) RF bias power, and (e) Vpp according to a sixth embodiment.

FIG. 10 is a timing chart showing (a) microwave power, (b) plasma density, (c) plasma impedance, (d) RF bias power, (e) RF bias reflected wave, and (f) Vpp according to a seventh embodiment.

FIG. 11A is a schematic configuration diagram of an ECR plasma etching apparatus according to an eighth embodiment.

FIG. 11B is a diagram showing a waveform of microwave power supplied to the ECR plasma etching apparatus in FIG. 11A.

FIG. 11C is a diagram showing a waveform of RF bias power supplied to the ECR plasma etching apparatus in FIG. 11A.

DESCRIPTION OF EMBODIMENTS

First Embodiment

Figures 12A, 12B, 12C:
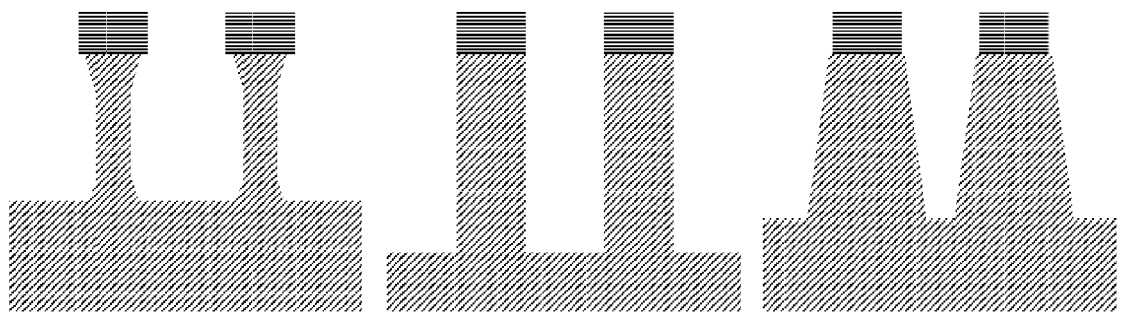
FIGS. 12A to 12C are enlarged cross-sectional views showing an etching shape of a wafer processed by an ECR plasma etching apparatus.

FIG. 1 is a schematic configuration diagram showing a longitudinal section of an ECR type microwave plasma etching apparatus (hereinafter, referred to as a plasma processing apparatus 1) according to an embodiment of the invention. Each part of a processing chamber, a sample stage, a sample, and the like in the plasma processing apparatus 1 has a schematically axisymmetric shape such as a cylinder, a column, or a circular disk. In the present specification, "a power is applied across a switching time" means that application of a power is started before the switching time and the application of the power continues until the switching time elapses, and for example, means that a second radio frequency power of each period A is supplied in a first period and a second period of a first radio frequency power.

(Configuration of Plasma Processing Apparatus)

In FIG. 1, a vacuum exhaust device 119 is connected to a lower portion of a processing chamber 122 inside a vacuum container 101 of the plasma processing apparatus 1. A shower plate 102 and a quartz top plate 103 are disposed in an upper portion of an interior of the processing chamber 122. The shower plate 102 has a plurality of holes. A gas for plasma etching processing supplied from a gas supply device 120 is introduced into the processing chamber 122 through the holes of the shower plate 102. The quartz top plate 103 is disposed over the shower plate 102, and a gas supply gap is provided between the quartz top plate 103 and the shower plate 102. The quartz top plate 103 through which electromagnetic waves from above transmit hermetically seals an upper side of the processing chamber 122.

A cavity resonance portion 104 is disposed on the quartz top plate 103. An upper portion of the cavity resonance portion 104 is open, and a waveguide 105 including a vertical waveguide extending in a vertical direction and a waveguide converter serving as a bending portion that bends a direction of the electromagnetic wave by 90 degrees is connected to the upper portion of the cavity resonance portion 104. The waveguide 105 and the like are oscillation waveguides that propagate the electromagnetic waves, and a microwave power supply 106 for plasma generation is connected to an end portion of the waveguide 105 via a tuner 107.

The microwave power supply 106, which is a first radio frequency power supply, is a power supply for plasma generation, and oscillates the electromagnetic waves (first radio frequency power) under a control of a control unit 123. The microwave power supply 106 according to the present embodiment can perform microwave oscillation of 2.45 GHz. The first radio frequency power is modulated by a first waveform in which a high section TH (first period) and a low section TL (second period adjacent to the first period) are alternately repeated.

The microwaves oscillated from the microwave power supply 106 propagates through the waveguide 105, and propagates into the processing chamber 122 via the cavity resonance portion 104, the quartz top plate 103, and the shower plate 102. A magnetic field generating coil 109 is disposed on an outer periphery of the processing chamber 122. The magnetic field generating coil 109 includes a plurality of coils, and forms a magnetic field in the processing chamber 122. A radio frequency power oscillated from the microwave power supply 106 generates high density plasma 121 in the processing chamber 122 by interaction between the magnetic field formed by the magnetic field generating coil 109 and ECR.

A sample stage 110 is disposed on a lower side of the processing chamber 122 so as to face the quartz top plate 103. The sample stage 110 holds a wafer 111, which is a sample, in a state in which the wafer 111 is placed thereon.

The sample stage 110 is made of aluminum or titanium as a material. A dielectric film 112 is provided on an upper surface of the sample stage 110. A sprayed film made of alumina ceramics or the like is disposed on an upper surface of the dielectric film 112 of the sample stage 110.

Conductive films (electrodes) 113, 114 for electrostatically aspirating the wafer 111 are provided inside the dielectric film 112, and a DC voltage (not shown) is applied, so that the wafer 111 can be electrostatically aspirated. The second radio frequency power (hereinafter referred to as an RF bias) is further applied to the conductive films 113, 114 of the sample stage 110 from an RF bias power supply 117 which is a second radio frequency power supply. The second radio frequency power is modulated by a second waveform in which an on section BON (period A) and an off section BOF (period B) are repeated.

A matching box (matcher) 115 is connected to the RF bias power supply 117 to match an RF bias. The matching box 115 functions such that the RF bias is matched even when a plasma impedance fluctuates at high speed due to a change in a plasma density that is caused by pulsed oscillation of the microwave. More specifically, the matching box 115 achieves matching at a level of several milliseconds by performing high-speed matching by a solid-state element, setting a matching section in which a period in which a plasma load (plasma impedance) rapidly fluctuates is invalidated and the other period is set as a matching effective range, fixing of matching in which disturbance of the plasma (load) is invalidated, optimization of matching by prediction of plasma (load), and the like.

The RF bias power supply 117 generates the radio frequency power for ion attraction and supplies the radio frequency power to the sample stage 110. The RF bias power supply 117 also generates a pulse-modulated RF bias based on a pulse from an RF bias pulse unit 118.

In the RF bias power supply 117 according to the present embodiment, a RF bias frequency is not particularly limited, and for example, 400 kHz can be used as the frequency.

In order to monitor a difference between a maximum value and a minimum value of a voltage in a radio frequency RF bias (V peak to peak: hereinafter abbreviated as Vpp), a voltage monitor (not shown) is provided on an RF bias power supply line.

A microwave pulse unit 108 is connected to the microwave power supply 106. By an on signal from the microwave pulse unit 108, the microwave power supply 106 can pulse-modulate the microwave at a set repetition frequency. The radio frequency power output from the microwave power supply 106 is referred to as microwave power.

In order to be capable of oscillating in a range of watts to 2000 watts and to accurately oscillate while ensuring responsiveness when pulse oscillation occurs, the microwave power supply 106 is not a magnetron type microwave power supply but a solid state type microwave power supply.

The control unit 123 is a control device of the plasma etching apparatus, and is connected to the microwave power supply 106 and the RF bias power supply 117 to control outputs of the first radio frequency power and the second radio frequency power.

Although not shown, the control unit 123 is also electrically connected to the gas supply device 120, the vacuum exhaust device 119, a DC power supply 116, and the like other than the microwave power supply 106 and the RF bias power supply 117 to control the gas supply device 120, the vacuum exhaust device 119, the DC power supply 116, and the like.

The control unit 123 controls, based on an input setting (also referred to as a recipe) by an input unit (not shown), parameters of the microwave power supply 106 and the RF bias power supply 117, such as a high power of the microwave power supply 106, a low power of the microwave power supply 106, a high power of the RF bias power supply 117, a low power of the RF bias power supply 117, a pulse on-off timing in the microwave pulse unit, a repetition frequency of on-off of the RF bias power supply 117 and a duty ratio, and a duty time of the RF bias power supply 117.

Other than the parameters of the microwave power supply 106 and the RF bias power supply 117, the control unit 123 controls etching parameters such as a flow rate of a gas for performing etching, a processing pressure, a coil current, a sample stage temperature, and an etching time.

(Operations of Plasma Processing Apparatus)

When the etching processing is started, the wafer 111 is transferred into the processing chamber 122. After the wafer 111 is aspirated to the sample stage 110, an etching gas passes through the quartz top plate 103 and the quartz shower plate 102 from the gas supply device 120 via a mass flow controller (not shown) based on the recipe, and is introduced into the processing chamber 122 from the gas holes of the quartz shower plate 102. Further, a predetermined pressure is set in the vacuum container 101, and the plasma 121 is generated in the processing chamber 122 by the oscillation of the microwave power supply 106. Further, the RF bias is output from the RF bias power supply 117, and ions are attracted from the plasma 121 to the wafer 111, so that the etching (plasma processing) is performed. The etching gas and a reaction product generated by the etching are exhausted from the exhaust device 119.

In the present embodiment, the shower plate 102, the sample stage 110, the magnetic field generating coil 109, the vacuum exhaust device 119, the wafer 111, and the like are disposed coaxially with respect to a center axis of the processing chamber 122. Therefore, the etching gas, the plasma, a saturated ion current, and the reaction product each have a coaxial distribution, and as a result, uniformity of the axisymmetric distribution related to an etching rate is improved.

Here, the parameters of the microwave pulse and the parameters of the RF bias are set as follows.

High power P1 of the microwave power supply 106: 600 watts (changeable in a range of 50 watts to 2000 watts),
Low power P2 of the microwave power supply 106: 150 watts (changeable in a range of 20 watts to 1600 watts),
Microwave power high-low frequency F1: 500 Hz,
Microwave power high-low cycle T1=1/F1 (sec),
Microwave power high-low duty ratio D1: 40%,
Microwave power high section TH: 1 millisecond,
Microwave power low section TL: 1 millisecond,
Microwave power on-off frequency F2: 100 Hz,
Microwave power on-off cycle T2=1/F2 (sec),
Microwave power on-off duty ratio D2: 80%,
Microwave power on time T3=T2×D2,
Microwave power on frequency F3 (=1/T3): 125 Hz,
(However, the microwave power high-low frequency F1 is a multiple of the microwave power on frequency F3. A start time of the microwave power high section TH is set as a reference point PST.)

RF bias on power: 100 watts (changeable in a range of 10 watts to 500 watts),
RF bias off power: 0 watts
RF bias high·low cycle TB (=T1): 2 milliseconds,
RF bias frequency FB1 (=1/TB): 500 Hz (changeable in a range of 10 Hz to 5000 Hz),
RF bias on section BON: 1 millisecond,
RF bias off section BOF: 1 millisecond,
RF bias duty ratio: 30% (changeable in a range of 1% to 100%),
RF bias delay time TD: 0.6 milliseconds,
RF bias delay RD (=TD/T1): 30%,
(However, the RF bias is not used except for the microwave power on time.)

FIG. 2 shows a sequence when the RF bias is applied across a switching time from the microwave power high section TH to the microwave power low section TL when the above parameters are set.

In FIG. 2, a graph of microwave power (a) is denoted by 201, a graph of plasma density (b) is denoted by 202, a graph of plasma impedance (c) is denoted by 204, and a graph of RF bias (d) is denoted by 205.

In this example, in order to obtain high shape controllability by etching, there are limitations on a pulse time range, a microwave power range, and a type of a gas used for etching.

As the type of the etching gas, a mixed gas obtained by mixing two or more kinds of types is desirable, and in this case, it is more preferable to use a mixed gas of a deposition gas for deposition and a gas serving as an etchant. In the present embodiment, a mixed gas of a chlorine gas (flow rate: 100 ml/sec) as the etchant gas and a CHF 3 gas (flow rate: 10 ml/sec) as the deposition gas is used.

There is no problem even under a condition in which the reaction product etched by the single etchant gas is reattached without using the mixed gas as described above. For example, in a case of etching silicon with a CF 4 gas, the same effect as in the case of using two types of mixed gases can be obtained by using the CF 4 gas as the etchant gas and considering the deposition gas as a silicon-based reaction product when the etching is performed on the silicon.

Next, regarding the microwave power range, the microwave low power P2 (amplitude in the second period) is smaller than the microwave high power P1 (amplitude in the first period) and larger than 0. Here, when a difference between the microwave high power P1 and the microwave low power P2 is small, for example, is 20% or less, a change width of the plasma density is small, and there is almost no delay in the plasma density with respect to the microwave power fluctuation, so that an effect of an etching shape cannot be obtained.

On the contrary, when the difference between the microwave high power P1 and the microwave low power P2 is large, for example, when a plasma having a plasma density of more than $7.5 \times 10^{16}$ $(m^{-3})$ is generated with the high power P1 of 1600 watts and the low power P2 of 50 watts or less immediately before a plasma misfire, it is difficult to correctly perform RF bias matching. Alternatively, when the difference between the high power P1 and the low power P2 is large, it is necessary to consider a transition time from the high section to the low section, and thus there is a problem that the plasma density does not change as shown in the graph 202 of FIG. 2.

In general, when the range of the microwave high power P1 is 50 watts to 2000 watts and the range of the microwave low power P2 is 20 watts to 1600 watts, it is desirable to determine the difference between the high power P1 and the low power P2 such that the low power P2 is 20% or more with respect to the high power P1.

The microwave power high·low frequency F1 and the microwave power high·low duty ratio D1 will be described. The plasma density follows a change in the microwave power of the microwave power high section TH and the microwave power low section TL with a certain number of delay time constant. With respect to the change in the microwave power, a time during which the plasma density is saturated to a constant level, or a so-called afterglow time during which the plasma density decreases to follow the change in the microwave power when the microwave power is switched from on to off, and a misfire occurs, is about 0.2 to 5 milliseconds.

As described above, when the microwave power high·low cycle T1 is shortened and the microwave power high·low frequency F1 is increased, the plasma density cannot follow a high-speed repetition of the high and low microwave power, the plasma is not stabilized, the plasma density is not saturated, and the plasma density is repeatedly increased and decreased. As a result, the plasma density repeatedly increases and decreases to a small value near an intermediate value.

This is not realistic since it is difficult to improve accuracy of the etching shape from a viewpoint of appropriately applying the RF bias when the plasma density is increased, and jitter of the pulsed RF bias is caused, so that a degree of difficulty of the RF bias matching is increased.

On the contrary, when the microwave power high·low cycle T1 is elongated and the microwave power high·low frequency F1 is decreased, in a transition section between the microwave power high section TH and the microwave power low section TL, a section in which the plasma density changes become sufficiently short with respect to the microwave power high·low cycle T1. Therefore, the accuracy of the etching shape cannot be expected to be improved.

Based on the above, it is desirable that the microwave power high·low frequency F1 is approximately set to 200 Hz to 5000 Hz, and the microwave power high·low duty ratio D1 is set to 10% to 90%. Further, it is preferable that the control unit 123 controls the matching box 115 to reduce a reflected power of the RF bias power so that the RF bias power matching is performed after a transition from the first period to the second period or after a transition from the second period to the first period.

Next, the RF bias frequency FB1 is the same as the microwave power high·low frequency F1, and there is no problem. An amplitude of the RF bias power in the period A (on section BON) is larger than an amplitude (preferably, zero) in the period B (off section BOF). Regarding an application timing of the RF bias, it is important that the RF bias is appropriately applied (RF bias reflected wave is 5% or less of the RF bias power) in a hatched region on a lower side of the graph 202 of FIG. 2 from the microwave power high section TH to the microwave power low section TL to the section 206 where the plasma density decreases.

As shown in FIG. 2(d), the application of the RF bias is performed prior to an end of the microwave power high section TH by a time TA. In other words, the control unit 123 controls the RF bias power supply 117 such that the second radio frequency power in each period A is supplied in a part of the first period and a part of the second period. When the time TA is set in this case, it is preferable to consider that an operation of the RF bias matching or the RF bias is not in a rump state, and that the etching is performed in this section.

In the example of FIG. 2, the time TA is set to 40% of the microwave power high section TH, but in practice, the time TA is determined depending on adjustment of the etching shape. For example, when it is desired to increase the etching rate and perform etching under high density plasma, the time TA can be extended as compared with the example of FIG. 2. On the other hand, when side etching, which is desired to be performed under low density plasma, is sufficiently performed, the RF bias can be applied in the microwave power low section TL by extending the RF bias on time or the RF bias duty ratio.

FIG. 3A shows a change in the plasma density when the etching is performed with different types of gases in the above sequence. FIG. 3B shows an enlarged view of the change in the plasma density and schematically shows etching shapes at certain time points.

When the microwave power (a) repeats between the microwave power high section TH and the microwave power low section TL as shown in a graph 301 under the above-described etching conditions, a plasma density (b) of a gas type A (chlorine) which is the etchant gas is as shown in a graph 302, and a plasma density (c) of a gas type B (CHF 3) which is the deposition gas is as shown in a graph 303.

When the microwave power high section TH is switched to the microwave power low section TL, the plasma density starts to decrease immediately, but as shown in FIG. 3B (a), the plasma density decreases with a response time and a certain number of delay time constant. Thereafter, the graphs 302 and 303 are asymptotically stabilized at a plasma density corresponding to a low plasma power in the microwave power low section TL.

When two kinds of gases, in particular, the deposition gas and the etchant gas are mixed and used, the plasma density of the etchant gas type A (chlorine) changes as indicated by a solid line of the graph 302, and the plasma density of the deposition gas type B (CHF 3) changes as indicated by a dotted line of the graph 303. There is a difference between time constants of the plasma densities of the etchant gas and the deposition gas, and a time constant of a density of plasma 308 generated by the deposition gas is generally larger than that of a density of plasma 307 generated by the etchant gas (achieving an equilibrium state takes time).

Therefore, during a period 304 (from time point 305 to time point 306) of the hatched region shown in (a) of FIG. 3B, a proportion of the plasma generated by the deposition gas type B (CHF 3) is larger than that of the plasma generated by the etchant gas. This is the same as a deposition rich state in which a large amount of the deposition gas type B is supplied for this short period.

Therefore, when the RF bias is not applied in this period 304, the deposition is applied more than necessary on a side of a pattern, so that not only the pattern becomes excessively tapered, but also ions do not enter a bottom of the pattern and etching in the vertical direction does not perform. On the other hand, by applying an appropriate amount (for example, 50 watts) of the RF bias during the period 304, it is possible to completely prevent the side etching while securing the etching performed in the vertical direction, or to adjust a sidewall protective film 310 by an appropriate amount to obtain a vertical etching shape. (b) of FIG. 3B shows a plasma etching state at the time point 305, and (c) of FIG. 3B shows a plasma etching state at the time point 306.

On the other hand, it can be said that the same effect can be obtained even when the etching is performed by changing a ratio of the etchant gas and the deposition gas in the period 304 to turn into the deposition rich state. However, it is not realistic to change the gas only in a short period of time at the millisecond level, and an influence on other etching performance such as selectivity and uniformity is very large, and thus the adjustment becomes difficult.

According to the present embodiment, the side etching can be prevented and the shape can be formed in the vertical direction by adding the application of the RF bias across the switching time of the microwave power high section TH and the microwave power low section TL to an etching pulse parameter method in the related art, for example, a method of applying the RF bias after waiting until the plasma is stabilized or a method of applying the RF bias immediately after the switching of the microwave power high section and the microwave power low section. Therefore, the influence on other etching performance is not large.

Second Embodiment

FIG. 4A shows, contrary to the example in FIG. 3A, the graphs of the plasma densities of the respective gases when the RF bias is applied across a switching time from the microwave power low section TL to the microwave power high section TH, and FIG. 4B is an enlarged view showing a change in the plasma density and schematically shows etching shapes.

Here, the plasma processing apparatus 1 according to the first embodiment is used, and the etching gas, the microwave, the RF bias power, the microwave pulse parameters, and the like are also used in common. The present embodiment is different from the first embodiment in that the RF bias delay time TD is set to 1.6 milliseconds and the RF bias delay RD is set to 80%.

As shown in FIG. 4A, when the microwave power low section TL is switched to the microwave power high section TH, the plasma density starts to increase and eventually saturates.

In the present embodiment, the plasma density of the etchant gas type A (chlorine) changes as shown in the graph 302, and the plasma density of the deposition gas type B (CHF 3) changes as shown in the graph 303. During a period 401 (from time point 402 to time point 403) of the hatched region in (a) of FIG. 4B, the plasma density of the etchant gas type A (chlorine) is higher the plasma density of the deposition gas type B.

When the RF bias is turned on in this period 401, chlorine ions, which are a large amount of etchant, are accelerated by the RF bias, and the chlorine ions enter the bottom of the pattern. As a result, the etching is performed in the vertical direction, and removal performance in a narrow region of a shape pattern 403 is improved. On the other hand, however, there is also a characteristic that the side etching is slightly performed. (b) of FIG. 4B shows a plasma etching state at the time point 402, and (c) of FIG. 4B shows a plasma etching state at the time point 403.

When a side etching shape as shown in FIG. 12A is obtained by the plasma etching in the related art, an etching shape shown in FIG. 12B is obtained by applying the RF bias across the switching time from the microwave power high section TH to the microwave power low section TL.

On the contrary, when a tapered side etching shape as shown in FIG. 12C is obtained by the plasma etching in the related art, it is desirable to adopt a method of applying the RF bias across the switching time from the microwave power low section TL to the microwave power high section TH.

Third Embodiment

FIG. 5 is a diagram showing parameters and ranges of microwave pulses in a sequence in which the pulse oscillation can be performed in three stages of a microwave power off power P0=0 from the microwave power supply in addition to the microwave high power P1 and the microwave low power P2. A change in the microwave power (a) is shown in a graph 501, and a change in the RF bias (b) is shown in a graph 502. In this example, the microwave power includes the high section TH (first period), the low section TL (second period), and an off section of which the amplitude is zero (T2-T3: third period).

The parameters of the microwave pulse include six parameters of the microwave high power P1, the microwave low power P2, the microwave power high·low frequency F1, the microwave power high·low duty ratio D1 (=TH/T1), the microwave power on·off frequency F2, and the microwave power on·off duty ratio D2 (=T3/T2).

Accordingly, the microwave power high·low cycle (T1) and the microwave power on·off cycle (T2) are determined, and the microwave power on time (T3) and the microwave power on frequency (F3) are determined.

After the microwave power shown in the graph 501 is switched from an off state to an on state, outputs of the high power (P1) and the low power (P2) are repeated a plurality of times, and then the microwave power returns to the off (P0) state. In order to perform such an output, when the microwave power on frequency is F3 and n is a natural number, it is necessary to set F1>F3 and F1=n×F3.

The etching can be performed when n is 1, and in this case, since the microwave power is F1=1×F3=F3, the microwave power is simply repeated in three stages of off, high, and low. However, in this example, even when the RF bias is applied across the switching time between the microwave power high section TH and the microwave power low section TL as in the first embodiment, a sufficient effect cannot be obtained, and from a viewpoint of the RF bias matching, the control becomes difficult, and thus n is preferably 2 or more.

In FIG. 5, the graph 502 shows pulse parameters of the RF bias corresponding to the microwave power. Basically, the third embodiment is the same as the first embodiment, but is different in that in a period other than the microwave power on time T3 (that is, the third period), the RF bias is not applied (the amplitude of the RF bias is zero) as indicated by a dotted line of the graph 502 in accordance with a principle that the RF bias is not applied.

By interrupting the application of the RF bias in the period other than the microwave power on time T3, an effect of improving the in-plane uniformity of the etching (rate) can be obtained. The pulse parameter set for improving the shape controllability set in the above embodiment may adversely affect the in-plane uniformity. In order to achieve both the shape controllability and the in-plane uniformity, the application of the microwave power is performed in a manner of three stages as shown in FIG. 5.

In the ECR type plasma etching apparatus according to the present embodiment, depending on an average power of the applied microwave power, unevenness occurs in an etching rate distribution due to bias of an in-plane distribution of the reaction product generated by the plasma etching and a distribution in the plasma processing chamber. In order to correct the unevenness, the etching rate distribution and the in-plane uniformity are adjusted to be the best by adjusting the microwave power on·off duty ratio.

Fourth Embodiment

Hereinafter, a fourth embodiment will be described. FIG. 6 is a diagram similar to FIG. 2, showing a state in which the RF bias to be applied is binarized to a high power P3 and a low power P4 in addition to a state in which the microwave power to be oscillated is binarized to the high power P1 and the low power P2. Here, a graph of microwave power (a) is denoted by 601, a graph of plasma density (b) is denoted by 602, a graph of plasma impedance (c) is denoted by 604, and a graph of RF bias (d) is denoted by 605.

The six parameters of the RF bias are the RF bias high power P3, a RF bias high duty ratio RHD (=BON/TB), a RF bias high delay HDL (time from the reference point PST to a time point at which the high power P3 starts to increase), the RF bias low power P4, the RF bias slow duty ratio RLD (=BOF/TB), and the RF bias slow delay LDL (time from the reference point PST to a time point at which the low power P4 starts to decrease). In the present embodiment, the period A (on section BON) in which the RF bias high power P3 is applied is longer than the first period (high section TH) and longer than the second period (low section TL).

As the parameters of the microwave power, the microwave high power P1 is set to 600 watts, the microwave low power P2 is set to 150 watts, the RF bias on power is set to 100 watts, the microwave power high·low cycle T1 is set to 2 milliseconds, the microwave power high·low frequency F1 is set to 500 Hz, the microwave power high section TH is set to 1 millisecond. When the RF bias high·low frequency is set to 500 Hz, the RF bias high duty ratio RHD is set to 70%, the RF bias slow duty ratio RLD is set to 30%, the RF bias high delay HDL is set to 50%, and the RF bias low delay LDL is set to 20%, a change of the RF bias applied is as shown in a graph 604.

There is no particular limitation on the parameters of the RF bias. Similarly to the pulse parameters of the microwave power, when the RF bias also repeats the high section and the low section, that is, when the RF bias is not turned off within one cycle of the RF bias, a sum of the "RF bias high duty ratio RHD" and the "RF bias slow duty ratio RLD" is required to be be 100%, and each duty ratio of the RF bias and each delay of the RF bias is required to be an appropriate percentage.

In the example shown in FIG. 6, the RF bias high delay HDL is 50% and the RF bias high duty ratio RHD is 70%, and thus a sum thereof is 120%, the RF bias slow delay LDL is 20%, and an original RF high delay is obtained by adding 30% of the RF bias slow duty ratio RLD.

Here, both the switching from the microwave power high section TH to the microwave power low section TL and the switching from the microwave power low section TL to the microwave power high section TH are performed within an on section of the RF bias high power. One of the effects is that the side etching shape and the tapered etching shape can be balanced by using the embodiment described above, and the other effect is that Vpp fluctuation can be prevented as much as possible as shown in FIG. 9, which will be described in detail later.

Fifth Embodiment

A fifth embodiment will be described. FIG. 7 is a diagram similar to FIG. 6. In FIG. 7, the six parameters of the RF bias which are the same as those in the fourth embodiment are used, the RF bias high power P3 is applied at a switching timing from the microwave power high section TH to the microwave power low section TL, and at the same time, the RF bias low power P4 is applied at a switching timing from the microwave power low section TL to the microwave power high section TH. A graph 704 shows a change in the RF bias supplied at this time. Here, for simplification, a magnitude of the RF bias high power P3 and a magnitude of the RF bias low power P4 are the same. That is, the RF bias repeatedly changes in a pulse form between zero and P3.

Here, as the parameters of the microwave power, the microwave high power P1 is set to 600 watts, the microwave low power P2 is set to 150 watts, the RF bias on power P3 is set to 100 watts, the microwave power high·low cycle T1 is set to 2 milliseconds, the microwave power high·low frequency F1 is set to 500 Hz, the microwave power high section TH is set to 1 millisecond. The RF bias high duty ratio RHD is set to 30%, the RF bias slow duty ratio RLD is set to 35%, the RF bias high delay HDL is set to 35%, and the RF bias low delay LDL is set to 90%.

In this case, there is no limitation that the sum of the "RF bias high duty ratio" and the "RF bias low duty ratio" is 100%.

The present embodiment is a method of applying the RF bias only at a selected timing at which the plasma density increases or decreases. It is preferable to apply the present embodiment to extreme etching control, for example, when it is desirable to completely form a deposition film on a side wall of the pattern while the etching of the bottom portion of the pattern is desired to be performed reliably, or when cycle etching in which deposition and etching are repeated in a short time is desired to be performed rather than achieving the uniformity of the in-plane distribution.

COMPARATIVE EXAMPLES

Next, comparative examples will be described. FIGS. 8A and 8B are diagrams similar to FIG. 7, but Vpp is added to (e). As in the above-described embodiment, the microwave power is supplied such that the microwave power high section TH and the microwave power low section TL are alternately repeated in a pulse shape, but in FIG. 8A shown as a first comparative example, the RF bias is a continuous wave (constant) as shown by a graph 801. A change in the Vpp of a voltage on the sample stage at this time is shown by a graph 802.

On the other hand, in FIG. 8B shown as a second comparative example, as shown by a graph 803, the RF bias high power is applied simultaneously with a start of the microwave power high section TH, and the RF bias low power is applied simultaneously with a start of the microwave power low section TL. A change in the Vpp of the voltage on the sample stage at this time is shown by a graph 804.

As shown in the graph 801, when the RF bias with the continuous wave is applied, the Vpp increases or decreases in accordance with an increase or decrease of the plasma impedance. In the RF bias with the continuous wave, since the RF bias matching is also performed at any timing (sequentially), the reflected wave is also generated in accordance with the increase or decrease of the plasma impedance. As a result, there is a concern that the Vpp fluctuation may greatly fluctuate more than that of the graph 802.

Next, as shown in FIG. 8B, in the method in which the RF bias high power is applied simultaneously with the start of the microwave power high section TH and the RF bias low power is applied simultaneously with the start of the microwave power low section TL, the RF bias changes as shown in the graph 803 with respect to the increase or decrease in the plasma density and the plasma impedance, and thus the Vpp of the RF bias high section in a latter half of the microwave power high section TH and the Vpp of the RF bias low section in a latter half of the microwave power low section TL are substantially equal to each other.

However, changing the magnitude of the RF bias at the moment of switching to the microwave power low section TL significantly influences the RF bias reflected wave and the Vpp fluctuation. One of the influences is that a matching point cannot be found due to a conflict between the RF bias fluctuation and the matching operation, or the operation is performed in a direction opposite to that of the matching, and thus more time is taken than a normal matching completion time. As a result, the RF bias and Vpp may not be appropriately applied to the sample stage. Therefore, it is preferable to apply the RF bias across the switching of the high microwave power and the low microwave power.

Sixth Embodiment

A sixth embodiment will be described. FIG. 9 is a diagram similar to FIG. 8B, and is a diagram showing a sequence showing a relationship between the microwave power, the RF bias, and the Vpp. A graph of microwave power (a) is denoted by 901, a graph of plasma density (b) is denoted by 902, a graph of plasma impedance (c) is denoted by 903, a graph of RF bias (d) is denoted by 904, and a graph of Vpp (e) is denoted by 905.

As shown in the graph 904, the RF bias is changed from a low power to a high power before switching from the microwave power low section TL to the microwave power high section TH, and is changed from the high power to the low power after switching from the microwave power high section TH to the microwave power low section TL.

The Vpp increases as the RF bias increases, but the plasma density is already stable, and the reflected wave hardly appears. Thereafter, when the microwave power low section TL is switched to the microwave power high section TH, the plasma density increases, and in contrast, the plasma impedance decreases. Accordingly, when the Vpp decreases, the plasma impedance becomes stable, and the Vpp also becomes stable.

Next, when the microwave power high section TH is switched to the microwave power low section TL, the Vpp also increases as the impedance increases, but since the RF bias is switched to the low power in the middle of the increase, the Vpp changes to decrease. The Vpp slightly changes depending on a matching mode of the RF bias, and the Vpp fluctuation is as shown in the graph 905. Specifically, the Vpp slightly increases and decreases in each switching of the microwave power high section TH and the microwave power low section TL, but directions of the changes in Vpp are the same, and a fluctuation range of the Vpp is very small as compared with the methods of FIGS. 8A and 8B.

When the etching is performed in a state where the fluctuation range of the Vpp is large, the following problems occur. One of the problems is related to reproducibility and stability of the etching processing. Specifically, the Vpp greatly fluctuates due to a difference between the timing at which the microwave power is applied and the timing at which the RF bias is applied, thereby causing an etching performance difference and eventually causing a machine difference.

Another problem relates to flatness and roughness of the etching shape. When the etching is performed while the Vpp of the RF bias greatly fluctuates, ion entering to the side wall of the pattern or the bottom surface of the pattern varies along a time axis, pattern roughness or defects of the etching shape such as a scalloping (stepped) shape may occur depending on cases, and there is a concern that electrical performance of an element formed of an etched wafer may be deteriorated. According to the present embodiment, such problems can be prevented.

Seventh Embodiment

A seventh embodiment will be described. FIG. 10 is a diagram similar to FIG. 2, in which (e) shows a change in the RF bias reflected waves and (f) shows a change in the Vpp. A method of matching the RF bias performed in the matching box 115 will be described with reference to FIG. 10.

In the present embodiment, the RF bias is already applied before the switching from the microwave power high section TH to the microwave power low section TL.

However, the section immediately after a start of the application of the RF bias is not within a matching effective period in the setting of the RF bias, and as a result, the matching operation of the RF bias is not performed. The plasma density approaches a saturation (stable) region as the microwave power is applied to the high power, but the RF bias reflected waves are generated to some extent as indicated by a graph 1004. A graph 1005 shows an effective change in the Vpp of the RF bias of 400 KHz applied to the sample stage. Since the plasma density is the highest in the section immediately after the start of the application of the RF bias, the plasma impedance is the lowest as shown in the graph 1001, and the Vpp of the RF bias is small. In consideration of the RF bias reflected waves and rump of the RF bias power, the microwave power high section TH ends in a region where the Vpp gradually increases and is just stable.

Thereafter, the microwave power high section TH is switched to the microwave power low section TL, but the application of the RF bias is maintained. Immediately after the switching, when the plasma density decreases and the plasma impedance increases as indicated by the graph 1001, the Vpp increases accordingly. The RF bias is set so as to be matched with respect to the impedance during the increase.

As shown in the graph 1001, since the plasma impedance rapidly increases, it is difficult to completely set the reflected wave to zero, but the RF bias reflected waves become smallest and the Vpp becomes the largest in a central section (referred to as matching point) of a matching region shown by hatching in FIG. 10.

Thereafter, as shown in the graph 1001, an increasing speed of the plasma impedance is loosened, and the reflected waves become negligibly small, and the Vpp does not decrease even when the RF bias matching is not performed.

The above operation is repeated periodically in the microwave power high·low cycle T1, and the matching points obtained as described above are held (not moved), so that substantially the same matching result is obtained.

More preferably, a method of calculating an average plasma impedance immediately after the switching from the microwave power high section TH to the microwave power low section TL and matching with respect to the average plasma impedance may be adopted.

As in the above-described embodiment, basically, it is preferable that the RF bias is already applied in the section preceding the microwave power high section TH and the microwave power low section TL, an average value of the plasma impedances immediately after the switching between the microwave power high section TH and the microwave power low section TL is set as the matching point of the RF bias, and the RF bias is applied at the timing at which the plasma density changes.

Eighth Embodiment

An eighth embodiment will be described. FIG. 11A is a schematic cross-sectional view showing a plasma processing apparatus including two sets of microwave power supply devices and two sets of RF bias power supply devices. FIG. 11B is a diagram showing a change in the microwave power used in the present embodiment, and FIG. 11C is a diagram showing a change in the RF bias used in the present embodiment.

A first microwave power supply device includes an inner peripheral portion microwave power supply 1101, an inner peripheral waveguide 1113, and an inner peripheral cavity resonator 1115, and a second microwave power supply device includes an outer peripheral portion microwave power supply 1102, an outer peripheral waveguide 1114, and an outer peripheral cavity resonator 1116. An inner peripheral portion microwave pulse unit 1103 controls an output of the inner peripheral portion microwave power supply 1101, and an outer peripheral portion microwave pulse unit 1104 controls an output of the outer peripheral portion microwave power supply 1102.

The two RF bias power supply devices are an inner peripheral portion RF bias power supply 1105 and an outer peripheral portion RF bias power supply 1106, and are connected to an electrode inner peripheral portion conductive film 1117 and an electrode outer peripheral portion conductive film 1118 via matching boxes, respectively.

An inner peripheral portion RF bias pulse unit 1107 controls an output of the inner peripheral portion RF bias power supply 1105, and an outer peripheral portion RF bias pulse unit 1108 controls an output of the outer peripheral portion RF bias power supply 1106.

The two microwave power supplies are configured to be capable of oscillating the microwave power in a pulse form (by performing pulse-modulation so as to repeatedly turn on and off) or oscillating the microwave power in a continuous wave form (without performing the pulse-modulation), and the two RF bias power supplies are also configured to be capable of applying the RF bias in a pulse form (by performing pulse-modulation so as to repeatedly turn on and off) or applying the RF bias in a continuous wave form (without performing the pulse-modulation).

As shown in a graph 1109 in FIG. 11A, one microwave power supply repeatedly turns on and off to oscillate the microwave power, and the other microwave power supply oscillates the microwave power in a continuous wave form. Accordingly, by a sum of the microwave powers applied to the processing chamber, as shown in a graph 1111 in FIG. 11B, it is possible to implement a three-stage oscillation system in which the microwave power is high, low, or off, and it is possible to implement the microwave power as shown in (a) of FIG. 5.

Further, for the two RF bias power supplies, as shown in a graph 1110 of FIG. 11A, when the application of one RF bias is binarized to the RF bias on power and the RF bias off power and the other RF bias is applied as a continuous wave in the same manner as the microwave power, a total amount of the RF bias applied to the sample stage changes as shown in a graph 1112 of FIG. 11C, and a method of applying the RF bias in a three-stage manner including high power, low power, and power off can be implemented.

As for the RF bias matching, it is important to adjust the matching on a pulse side of the on·off of the RF bias, and it is desirable to set only a section immediately after the switching the microwave power supply from a power on state to a power off state as the matching effective section.

Further, with respect to the above, when each microwave power supply allows the three stages of high, low and off of the microwave power, for example, the microwave power can be oscillated in five stages by combining the three stages. Similarly, the RF bias power supply can apply the RF bias in five stages by a combination of high, low and off of a plurality of RF biases.

There is a concern that a timing at which the RF bias on power is applied becomes complicated, but basically, according to the principle that all of the RF biases are not applied in the microwave power off section, it is possible to further improve the accuracy of the above-described embodiments and further improve the etching shape controllability.

In the present embodiment, all the RF bias power supplies have the same oscillation frequency (400 KHz), but even when the frequencies of the two RF bias power supplies are different (for example, 400 KHz and 2 MHz), the same effect is obtained. By applying biases having different frequencies of a plurality of RF biases, improvement of the in-plane uniformity can be expected.

Oscillation frequencies of the microwave power supplies may be different from each other (for example, 2.45 GHz and 915 MHz). In this case, separation or interference between the microwaves from the inner peripheral portion microwave power supply and the microwaves from the outer peripheral portion microwave power supply can be prevented, and controllability of the in-plane uniformity can be expected to be improved as in the case of the RF bias.

The above embodiments are described with reference to the ECR type plasma etching apparatus, but the invention can be similarly applied to a plasma etching apparatus or the like corresponding to a type of generating plasma such as capacitively coupled plasma or inductively coupled plasma. One of the above embodiments may be combined with another embodiment.

REFERENCE SIGNS LIST

1: plasma processing apparatus, 101: vacuum container, 102: shower plate, 103: quartz top plate, 104: cavity resonance portion, 105: waveguide, 106: microwave power supply, 107: tuner, 108: microwave pulse unit, 109: magnetic field generating coil, 110: sample stage, 111: wafer, 112: dielectric film, 113, 114: conductive film, 115: matching box, 117: RF bias power supply, 118: RF bias pulse unit, 119: vacuum exhaust device, 120: gas supply device, 121: plasma, 122: processing chamber, 123: control unit, 1101: inner peripheral portion microwave power supply, 1102: outer peripheral portion microwave power supply, 1103: inner peripheral portion microwave pulse unit, 1105: inner peripheral portion RF bias power supply, 1106: outer peripheral portion RF bias power supply, 1107: inner peripheral portion RF bias pulse unit, 1108: outer peripheral portion RF bias pulse unit

The invention claimed is:

1. A plasma processing apparatus comprising:
a processing chamber in which a sample is subjected to plasma processing;
a first radio frequency power supply configured to supply a first radio frequency power with which plasma is generated;
a sample stage on which the sample is placed;
a second radio frequency power supply configured to supply a second radio frequency power to the sample stage; and
a control device configured to, when the first radio frequency power is modulated by a first waveform having a first period and a second period adjacent to the first period and the second radio frequency power supply is modulated by a second waveform having a period A and a period B, control the second radio frequency power supply such that each second radio frequency power in the period A is supplied in the first period and the second period, wherein
an amplitude in the second period is smaller than an amplitude in the first period and larger than 0, and
an amplitude in the period A is larger than an amplitude in the period B.

2. The plasma processing apparatus according to claim 1, wherein
the control device controls the second radio frequency power supply such that each second radio frequency power in the period A is supplied in a part of the first period and a part of the second period.

3. The plasma processing apparatus according to claim 2, wherein
an amplitude in the period B is zero.

4. The plasma processing apparatus according to claim 1, wherein
the period A is longer than the first period.

5. The plasma processing apparatus according to claim 4, wherein
an amplitude in the period B is zero.

6. The plasma processing apparatus according to claim 1, wherein
the first waveform has a third period, and
an amplitude in the third period is zero.

7. The plasma processing apparatus according to claim 6, wherein
the control device controls the second radio frequency power supply such that the second radio frequency power is not supplied in the third period.

8. The plasma processing apparatus according to claim 1, further comprising:
a matching box configured to reduce reflected power of the second radio frequency power, wherein
the control device controls the matching box such that matching of the second radio frequency power is performed after a transition from the first period to the second period or after a transition from the second period to the first period.

9. The plasma processing apparatus according to claim 1, wherein:
the period A is longer than the second period.

10. The plasma processing apparatus according to claim 1, wherein
the first radio frequency power supply includes a radio frequency power supply configured to supply a radio frequency power that is not pulse-modulated and a radio frequency power supply configured to supply a pulse-modulated radio frequency power.

11. The plasma processing apparatus according to claim 10, wherein
the second radio frequency power supply includes a radio frequency power supply configured to supply a radio frequency power that is not pulse-modulated and a radio frequency power supply configured to supply a pulse-modulated radio frequency power.

* * * * *